United States Patent
Wang et al.

(10) Patent No.: US 8,710,387 B2
(45) Date of Patent: Apr. 29, 2014

(54) LED PACKAGE CHIP CLASSIFICATION SYSTEM

(75) Inventors: Bily Wang, Hsin Chu (TW); Kuei-Pao Chen, Hsinchu County (TW); Hsin-Cheng Chen, Hsinchu County (TW)

(73) Assignee: Youngtek Electronics Corporation, Hsinchu (TW)

( * ) Notice: Subject to any disclaimer, the term of this patent is extended or adjusted under 35 U.S.C. 154(b) by 321 days.

(21) Appl. No.: 13/204,616

(22) Filed: Aug. 5, 2011

(65) Prior Publication Data
US 2012/0285869 A1 Nov. 15, 2012

(30) Foreign Application Priority Data
May 9, 2011 (TW) .............................. 100116170 A

(51) Int. Cl.
*B07C 5/00* (2006.01)
(52) U.S. Cl.
USPC ..................................... 209/571; 324/759.03
(58) Field of Classification Search
USPC ............. 209/571–574; 414/222.01, 935, 936; 198/441; 324/158.1, 750.16, 750.22, 324/750.23, 759.03
See application file for complete search history.

(56) References Cited

U.S. PATENT DOCUMENTS

| | | | | |
|---|---|---|---|---|
| 5,568,870 A | * | 10/1996 | Utech | 209/573 |
| 6,227,345 B1 | * | 5/2001 | Miyamoto | 198/392 |
| 6,479,777 B2 | * | 11/2002 | Yamakawa | 209/574 |
| 6,967,475 B2 | * | 11/2005 | Tsui et al. | 324/757.04 |
| 7,017,731 B2 | * | 3/2006 | Ikeda et al. | 198/464.3 |
| 7,851,721 B2 | * | 12/2010 | Sze et al. | 209/573 |
| 8,305,104 B2 | * | 11/2012 | Garcia et al. | 324/757.01 |
| 2011/0053295 A1 | * | 3/2011 | Yoon et al. | 438/15 |
| 2011/0316579 A1 | * | 12/2011 | Ryu | 324/762.07 |
| 2012/0205297 A1 | * | 8/2012 | Wang et al. | 209/573 |
| 2013/0015859 A1 | * | 1/2013 | Tseng et al. | 324/414 |
| 2013/0169300 A1 | * | 7/2013 | Ishikawa et al. | 324/750.22 |

* cited by examiner

*Primary Examiner* — Joseph C Rodriguez
(74) *Attorney, Agent, or Firm* — Li & Cai Intellectual Property (USA) Office

(57) ABSTRACT

An LED package chip classification system includes a rotation unit for transporting a plurality of LED package chips, a chip test unit, and a chip classification unit. The rotation unit includes a rotary turntable, a plurality of receiving portions formed on the rotary turntable, and a plurality of suction-exhaust dual-purpose openings respectively disposed in the receiving portions. Each LED package chip has a positive electrode pad and a negative electrode pad disposed on the bottom side thereof. The chip test unit includes a chip test module adjacent to the rotation unit for testing each LED package chip. The chip classification unit includes a plurality of chip classification modules adjacent to the rotation unit for classifying the LED package chips. Therefore, the LED package chips can be classified by matching the rotation unit, the chip test unit, and the chip classification unit.

16 Claims, 11 Drawing Sheets

LED PACKAGE CHIP CLASSIFICATION SYSTEM

BACKGROUND OF THE INVENTION

1. Field of the Invention

The instant disclosure relates to a classification system, and more particularly, to an LED package chip classification system.

2. Description of Related Art

In the semiconductor fabricating process, some small particles and defects are unavoidable. As the size of devices shrinks and the integration of circuits increases gradually, those small particles or defects affect the property of the integrated circuits more seriously.

For improving the reliability of semiconductor devices, a plurality of tests are performed continuously to find the root cause of the defects or particles. Then, process parameters can be tuned correspondingly to reduce a presence of defects or particles so as to improve the yield and reliability of the semiconductor fabricating process.

SUMMARY OF THE INVENTION

One aspect of the instant disclosure relates to an LED package chip classification system for classifying a plurality of LED package chips.

One of the embodiments of the instant disclosure provides an LED package chip classification system, comprising: a rotation unit for transporting a plurality of LED package chips, a bearing unit, a chip test unit, and a chip classification unit. The rotation unit includes at least one rotary turntable, a plurality of receiving portions formed on the rotary turntable, and a plurality of suction-exhaust dual-purpose openings respectively disposed in the receiving portions, each receiving portion selectively receives at least one of the LED package chips, and each LED package chip has a positive electrode pad and a negative electrode pad disposed on the bottom side thereof. The bearing unit includes at least one bearing base, and the at least one rotary turntable is disposed on the at least one bearing base. The chip test unit includes at least one chip test module adjacent to the rotation unit for testing each LED package chip. The chip classification unit includes a plurality of chip classification modules adjacent to the rotation unit for classifying the LED package chips that have been tested by the at least one chip test module, and the chip classification modules surround the at least one rotary turntable.

Furthermore, the LED package chip classification system further comprises a transportation unit including at least one transportation element adjacent to the rotary turntable for sequentially transporting each LED package chip to the corresponding receiving portion. The LED package chip classification system further comprises a chip position detection unit including a light emitting element disposed above the receiving portion and adjacent to the at least one transportation element and a chip position detection element disposed under the receiving portion and corresponding to the light emitting element, wherein light beams generated by the light emitting element are selectively projected onto the top surface of the LED package chip or transmitted to the chip position detection element through a through hole penetrating through the at least one bearing base and disposed under the receiving portion in order to judge whether the LED package chip is transmitted from the at least one transportation element to the receiving portion. The LED package chip classification system further comprises a chip breakaway detection unit including a plurality of light emitting elements respectively disposed above the different receiving portions and adjacent to the different chip classification modules and a plurality of chip breakaway detection elements respectively disposed under the different receiving portions and corresponding to the light emitting elements, wherein light beams generated by each light emitting element are selectively projected onto the top surface of the LED package chip or transmitted to the chip breakaway detection element through a through hole penetrating through the at least one bearing base and disposed under the receiving portion in order to judge whether the LED package chip is transmitted from the receiving portion to the chip classification module.

One of the embodiments of the instant disclosure provides an LED package chip classification system, comprising: a first rotation unit for transporting a plurality of LED package chips, a chip test unit, a second rotation unit, a bearing unit, a first chip classification unit, and a second chip classification unit. The first rotation unit includes at least one first rotary turntable, a plurality of first receiving portions formed on the first rotary turntable, and a plurality of first suction-exhaust dual-purpose openings respectively disposed in the first receiving portions, each first receiving portion selectively receives at least one of the LED package chips, and each LED package chip has a positive electrode pad and a negative electrode pad disposed on the bottom side thereof. The chip test unit includes at least one chip test module adjacent to the first rotation unit for testing each LED package chip. The second rotation unit is adjacent to the first rotation unit. The second rotation unit includes at least one second rotary turntable, a plurality of second receiving portions formed on the second rotary turntable, and a plurality of second suction-exhaust dual-purpose openings respectively disposed in the second receiving portions, and each second receiving portion selectively receives at least one of the LED package chips transmitted from the first rotation unit. The bearing unit includes at least one bearing base, and the at least one first rotary turntable and the at least one second rotary turntable are disposed on the at least one bearing base. The first chip classification unit includes a plurality of first chip classification modules adjacent to the first rotation unit for classifying the LED package chips that have been tested by the at least one chip test module, and the first chip classification modules surround the at least one first rotary turntable. The second chip classification unit includes a plurality of second chip classification modules adjacent to the second rotation unit for classifying the LED package chips that have been tested by the at least one chip test module, and the second chip classification modules surround the at least one second rotary turntable.

Furthermore, the LED package chip classification system further comprises a chip position detection unit including a light emitting element disposed above the first receiving portion and adjacent to the at least one transportation element and a chip position detection element disposed under the first receiving portion and corresponding to the light emitting element, wherein light beams generated by the light emitting element are selectively projected onto the top surface of the LED package chip or transmitted to the chip position detection element through a through hole penetrating through the at least one bearing base and disposed under the first receiving portion in order to judge whether the LED package chip is transmitted from the at least one transportation element to the first receiving portion. The LED package chip classification system further comprises a first chip breakaway detection unit including a plurality of first light emitting elements respectively disposed above the different first receiving portions and adjacent to the different first chip classification modules and a plurality of first chip breakaway detection elements respectively disposed under the different first receiving portions and corresponding to the first light emitting elements. The LED package chip classification system further comprises a second chip breakaway detection unit including a plurality of second light emitting elements respectively disposed above the different second receiving portions and adjacent to the different second chip classification modules and a plurality of second chip breakaway detection elements respectively disposed under the different second receiving portions and corresponding to the second light emitting elements.

Therefore, the LED package chip classification system of the instant disclosure can be used to classify the LED package chips by matching the rotation unit, the chip test unit, and the chip classification unit.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

BRIEF DESCRIPTION OF THE DRAWINGS

FIG. 1D(B) shows a lateral, cross-sectional, schematic view of when the chip test unit used to test the LED package chip according to the first embodiment of the instant disclosure;

FIG. 1D(C) shows a lateral, cross-sectional, schematic view of after using the chip test unit to test the LED package chip according to the first embodiment of the instant disclosure;

FIG. 1G(B) shows a lateral, cross-sectional, schematic view of after separating the LED package chip from the first receiving portion or the second receiving portion according to the first embodiment of the instant disclosure;

DETAILED DESCRIPTION OF THE PREFERRED EMBODIMENTS

First Embodiment

Figure 1A:
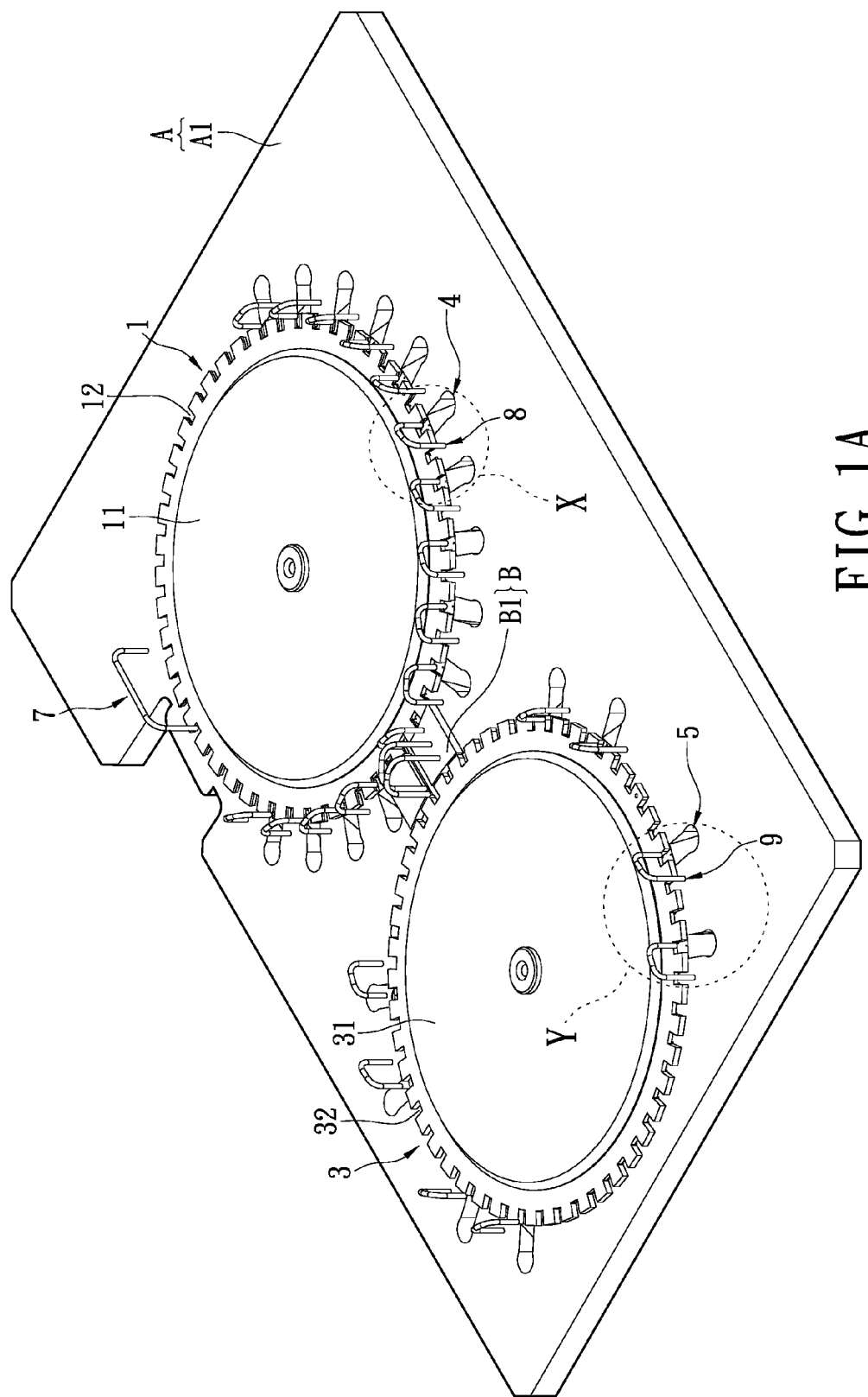
FIG. 1A shows a perspective, schematic view of the LED package chip classification system according to the first embodiment of the instant disclosure.

Referring to FIGS. 1A to 1G, where the first embodiment of the instant disclosure provides an LED package chip classification system, comprising: a first rotation unit 1 for transporting a plurality of LED package chips C, a chip test unit 2, a second rotation unit 3, a first chip classification unit 4, and a second chip classification unit 5.

Figure 1B:
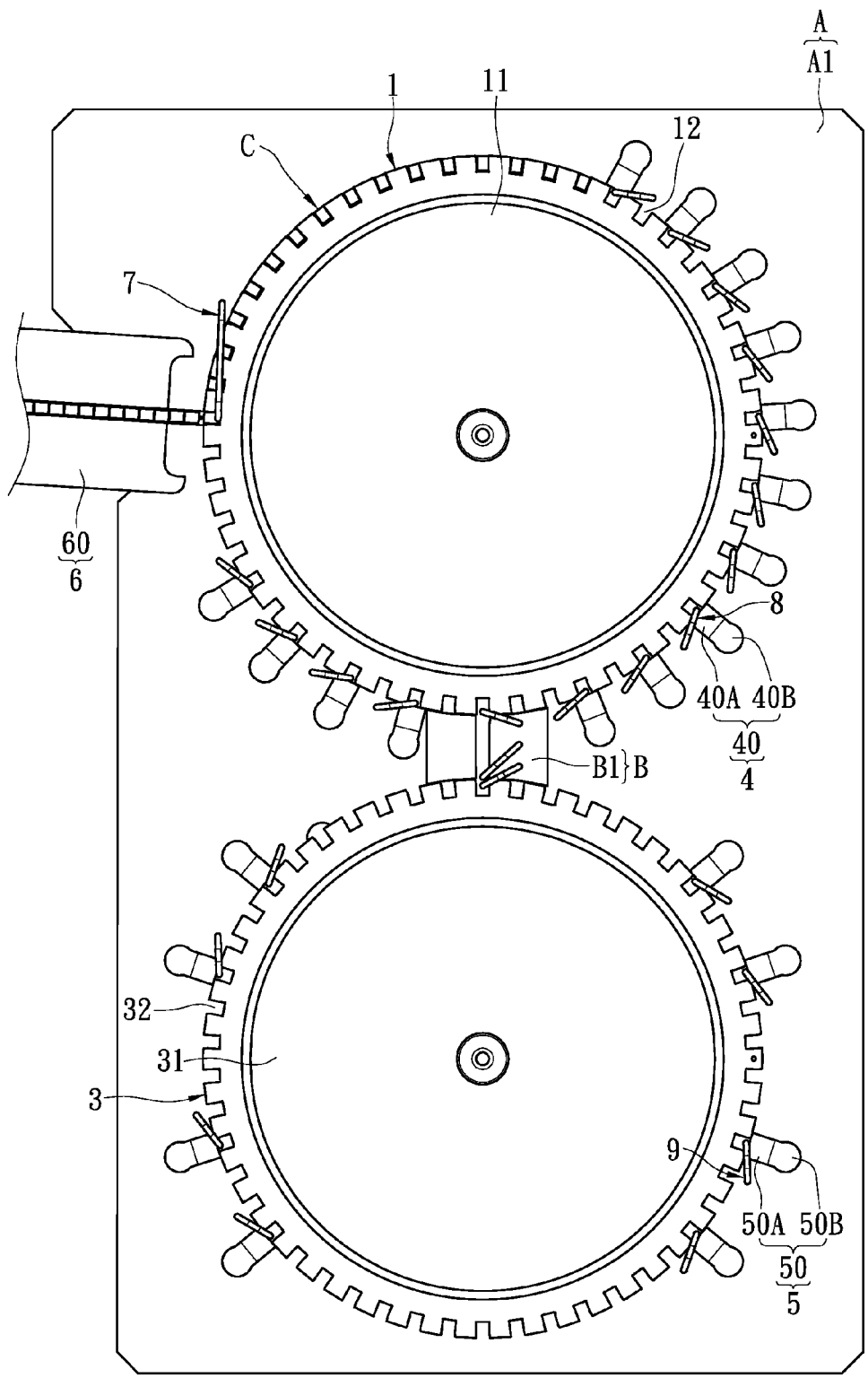
FIG. 1B shows a top, schematic view of the LED package chip classification system according to the first embodiment of the instant disclosure.
Figure 1C:
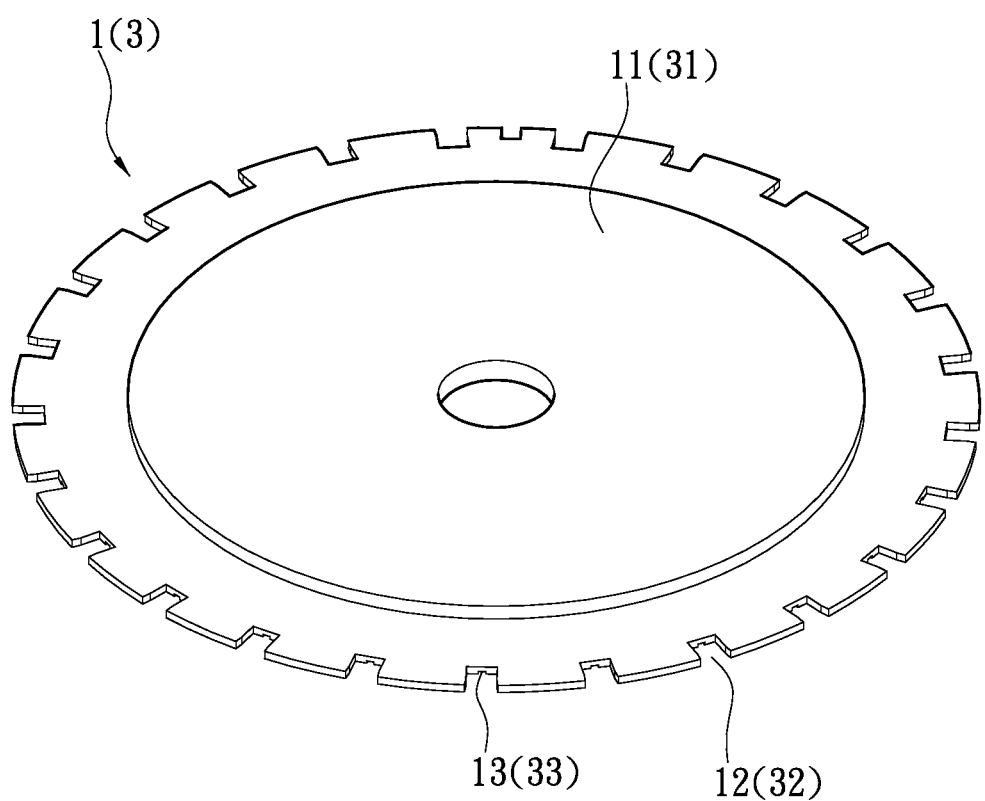
FIG. 1C shows a perspective, schematic view of the first rotation unit or the second rotation unit of the LED package chip classification system according to the first embodiment of the instant disclosure.
Figure 1D:
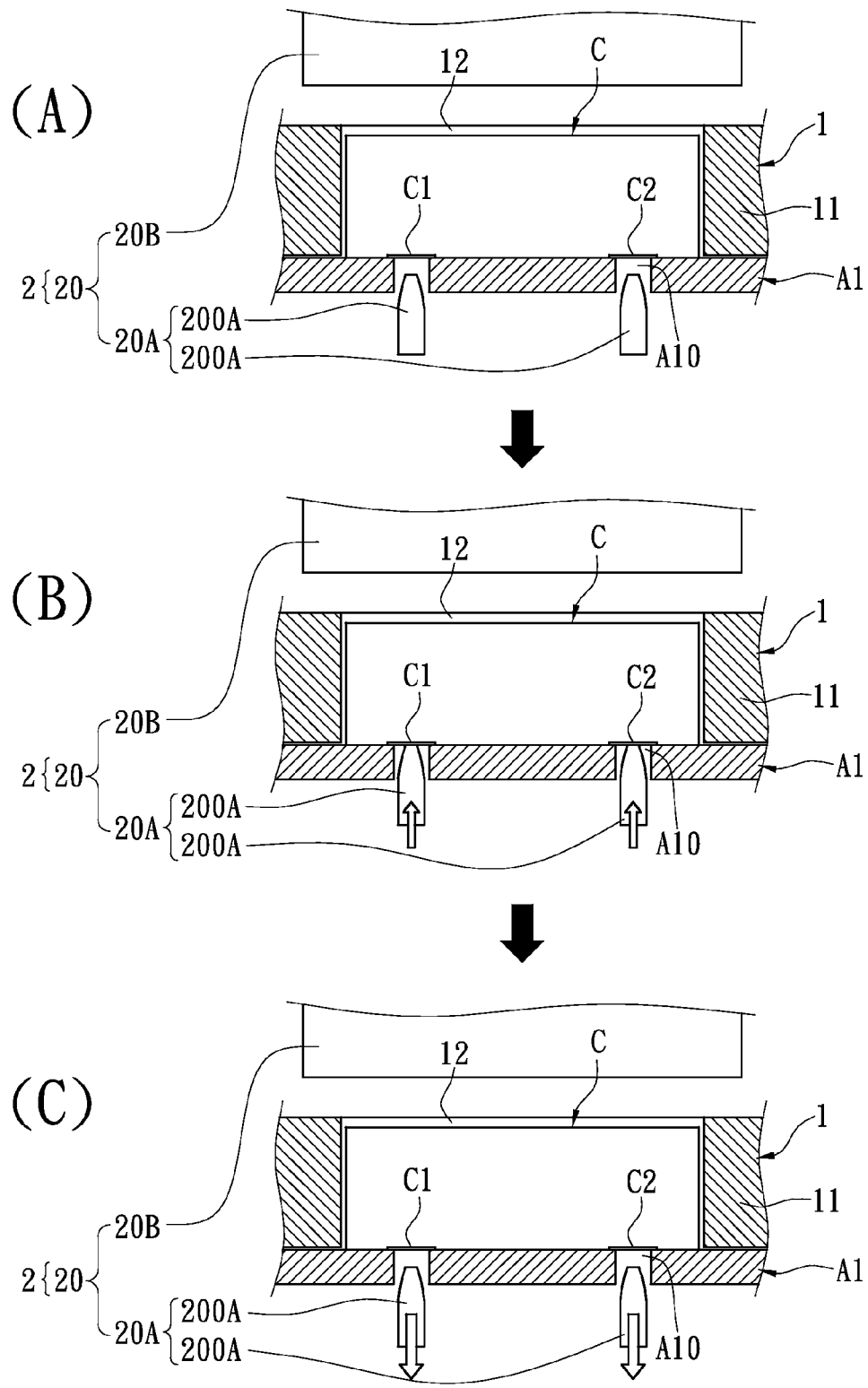
FIG. 1D(A) shows a lateral, cross-sectional, schematic view of before using the chip test unit to test the LED package chip according to the first embodiment of the instant disclosure.

Referring to FIGS. 1A, 1B, 1C, and 1D, the first rotation unit 1 includes at least one first rotary turntable 11, a plurality of first receiving portions 12 formed on the first rotary turntable 11, and a plurality of first suction-exhaust dual-purpose openings 13 respectively disposed in the first receiving portions 12. Each first receiving portion 12 can selectively receive at least one of the LED package chips C (as shown in FIG. 1B), and each LED package chip C has a positive electrode pad C1 and a negative electrode pad C2 disposed on the bottom side thereof (as shown in FIG. 1D). For example, the first receiving portions 12 can be arranged as an annular shape. The first receiving portions 12 can be surroundingly formed on the peripheral surface of the at least one first rotary turntable 11 and each first receiving portion 12 has an outward opening, thus each LED packaged chip C can enter the first receiving portion 12 through the outward opening. In addition, the first embodiment of the instant disclosure further comprises a bearing unit A including at least one bearing base A1, and the at least one first rotary turntable 11 is disposed on the at least one bearing base A1.

Referring to FIGS. 1A, 1B, and 1D, the chip test unit 2 includes at least one chip test module 20 adjacent to the first rotation unit 1 for testing each LED package chip C. Nevertheless, a plurality of chip test modules 20 can also be used in the instant disclosure at the same time according to different requirements. In addition, the at least one chip test module 20 includes a power supply element 20A under the LED package chip C to supply power to the LED package chip C and a chip test element 20B disposed above the LED package chip C to test each LED package chip C for obtaining the luminescent property of each LED package chip C. For example, the power supply element 20A may be two conductive pins 200A for providing a positive power source and a negative power source, and the chip test element 20B may be a sensor or an analysis instrument for testing the luminescent property (such as brightness) of each LED package chip C.

The test method of the at least one chip test module 20 is shown in FIG. 1D from (A) to (C). Before using the at least one chip test module 20 to test the LED package chip C as shown in the step (A) of FIG. 1D, the LED package chip C is disposed is received in the corresponding first receiving portion 12 of the first rotation unit 1 and above the power supply element 20A. When the at least one chip test module 20 is used to test the LED package chip C as shown in the step (B) of FIG. 1D, the two conductive pins 200A of the power supply element 20A are moved upwardly (as the direction of the arrow shown in the step (B) of FIG. 1D) at the same time to pass through the openings A10 of the bearing base A1 and the two conductive pins 200A respectively electrically contact the positive electrode pad C1 and the negative electrode pad C2 of the LED package chip C. After using the at least one chip test module 20 to test the LED package chip C as shown in the step (C) of FIG. 1D, the two conductive pins 200A of the power supply element 20A are moved downwardly (as the direction of the arrow shown in the step (C) of FIG. 1D) to go back the original position as shown in the step (A) of FIG. 1D at the same time.

Referring to FIGS. 1A, 1B, and 1C, the shape of the second rotation unit 3 is the same as that of the first rotation unit 1, and the second rotation unit 3 is adjacent to the first rotation unit 1. The second rotation unit 3 includes at least one second rotary turntable 31, a plurality of second receiving portions 32 formed on the second rotary turntable 31, and a plurality of second suction-exhaust dual-purpose openings 33 respectively disposed in the second receiving portions 32. Each second receiving portion 32 can selectively receive at least one of the LED package chips C transmitted from the first rotation unit 1. For example, the second receiving portions 32 can be arranged as an annular shape. The second receiving portions 32 can be surroundingly formed on the peripheral surface of the at least one second rotary turntable 31 and each second receiving portion 32 has an outward opening, thus each LED packaged chip C transmitted from the first rotation unit 1 can enter the second receiving portion 32 through the outward opening. In addition, the first rotary turntable 11 and the second rotary turntable 31 can be disposed on the bearing base A1 at the same time. The bearing base A1 can also be divided into two separated bases (not shown), and the first rotary turntable 11 and the second rotary turntable 31 can be respectively disposed on the two separated bases (not shown).

Figure 1E:
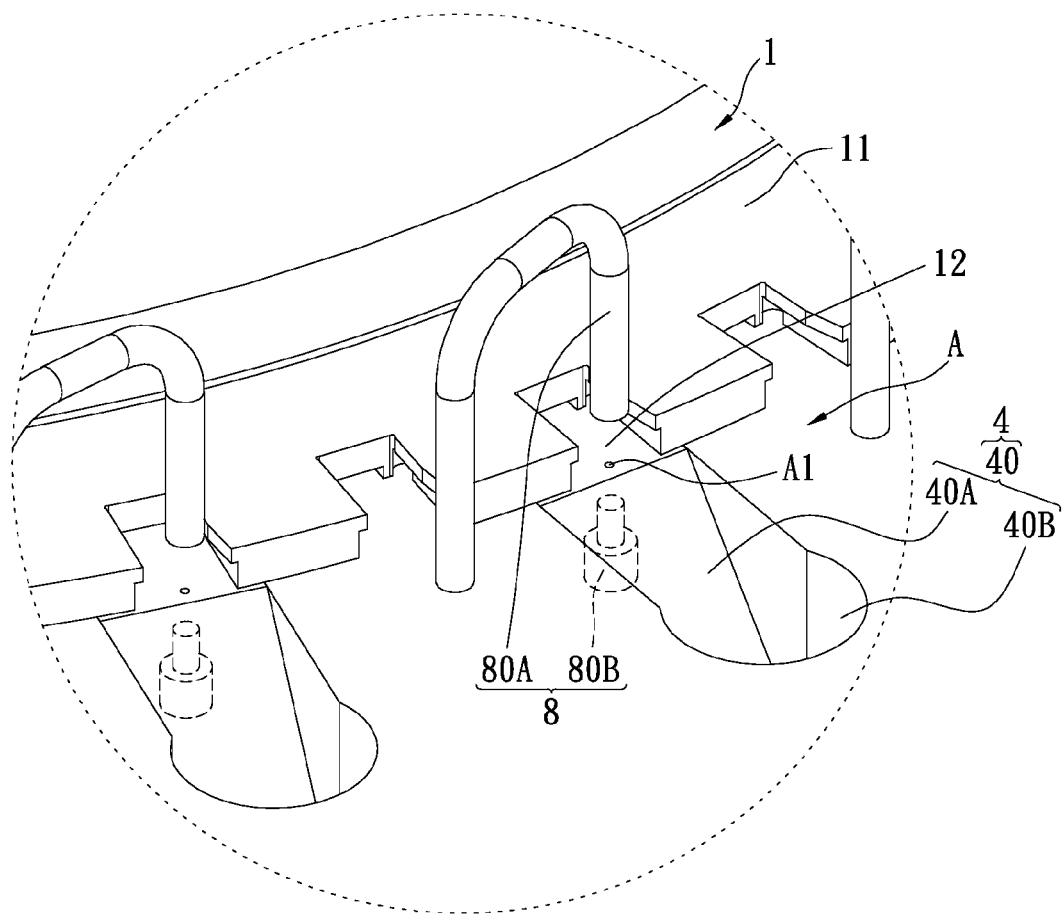
FIG. 1E shows an enlarged view taken on part X of FIG. 1A.

Referring to FIGS. 1A, 1B, and 1E, the first chip classification unit 4 includes a plurality of first chip classification modules 40 adjacent to the first rotation unit 1 for classifying the LED package chips C that have been tested by the at least one chip test module 20, and the first chip classification modules 40 surround the at least one first rotary turntable 11. In addition, each first chip classification module 40 includes a first passing portion 40A and a first accommodating portion 40B communicated with the first passing portion 40A, and the first passing portion 40A and the first accommodating portion 40B of each first chip classification module 40 are mated with each other to receive the LED package chips C with the same luminescent property. For example, the first passing portion 40A may be a first passing inclined plane communicated with the first receiving portion 12, the first accommodating portion 40B may be a first accommodating opening communicated with the first passing inclined plane, and the first passing inclined plane (the first passing portion 40A) is gradually and downwardly inclined from the first receiving portion 12 to the first accommodating opening (the first accommodating portion 40B).

Figure 1F:
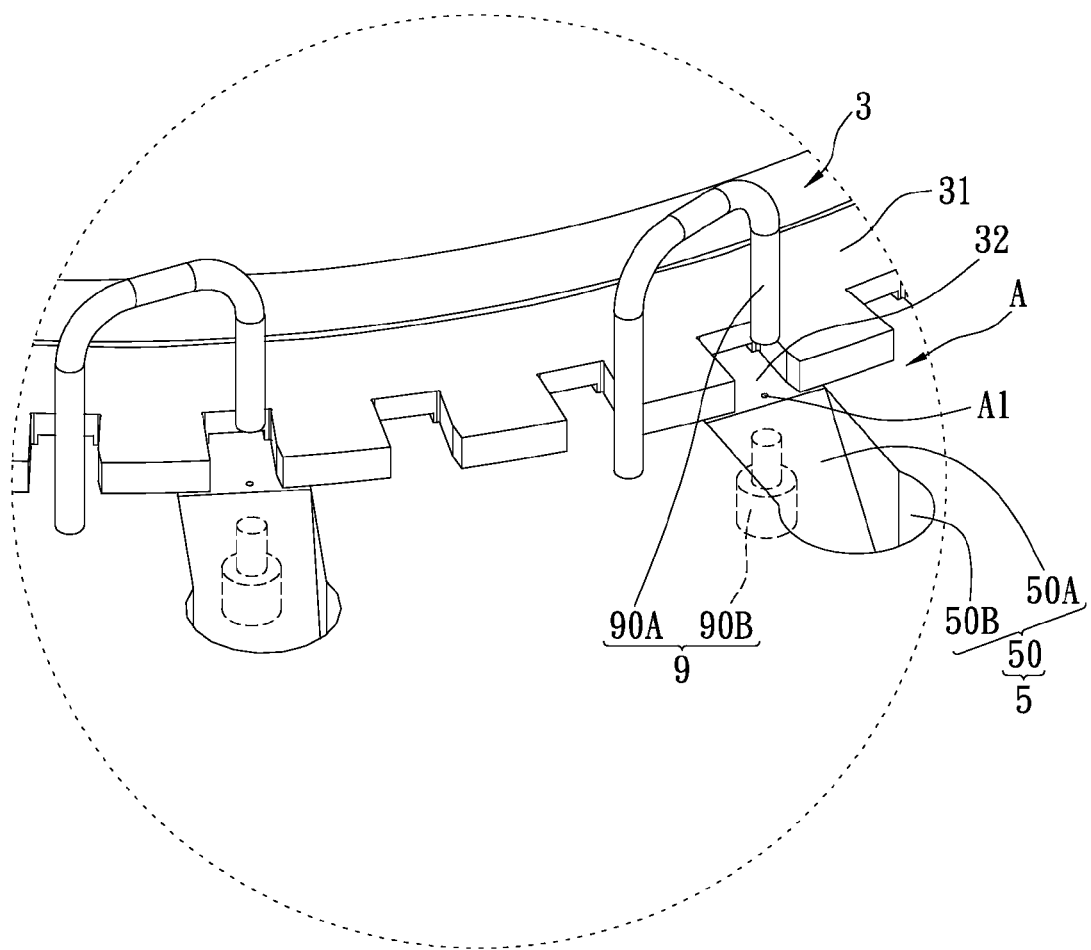
FIG. 1F shows an enlarged view taken on part Y of FIG. 1A.

Referring to FIGS. 1A, 1B, and 1F, the second chip classification unit 5 includes a plurality of second chip classification modules 50 adjacent to the second rotation unit 3 for classifying the LED package chips C that have been tested by the at least one chip test module 20, and the second chip classification modules 50 surround the at least one second rotary turntable 31. In addition, each second chip classification module 50 includes a second passing portion 50A and a second accommodating portion 50B communicated with the second passing portion 50A, and the second passing portion 50A and the second accommodating portion 50B of each second chip classification module 50 are mated with each other to receive the LED package chips C with the same luminescent property. For example, the second passing portion 50A may be a second passing inclined plane communicated with the second receiving portion 32, the second accommodating portion 50B may be a second accommodating opening communicated with the second passing inclined plane, and the second passing inclined plane (the second passing portion 50A) is gradually and downwardly inclined from the second receiving portion 32 to the second accommodating opening (the second accommodating portion 50B).

Referring to FIGS. 1A and 1B, the first embodiment of the instant disclosure further comprises a transportation unit 6 including at least one transportation element 60 adjacent to the first rotary turntable 11 for sequentially transporting each LED package chip C to the corresponding first receiving portion 12.

Figure 1G:
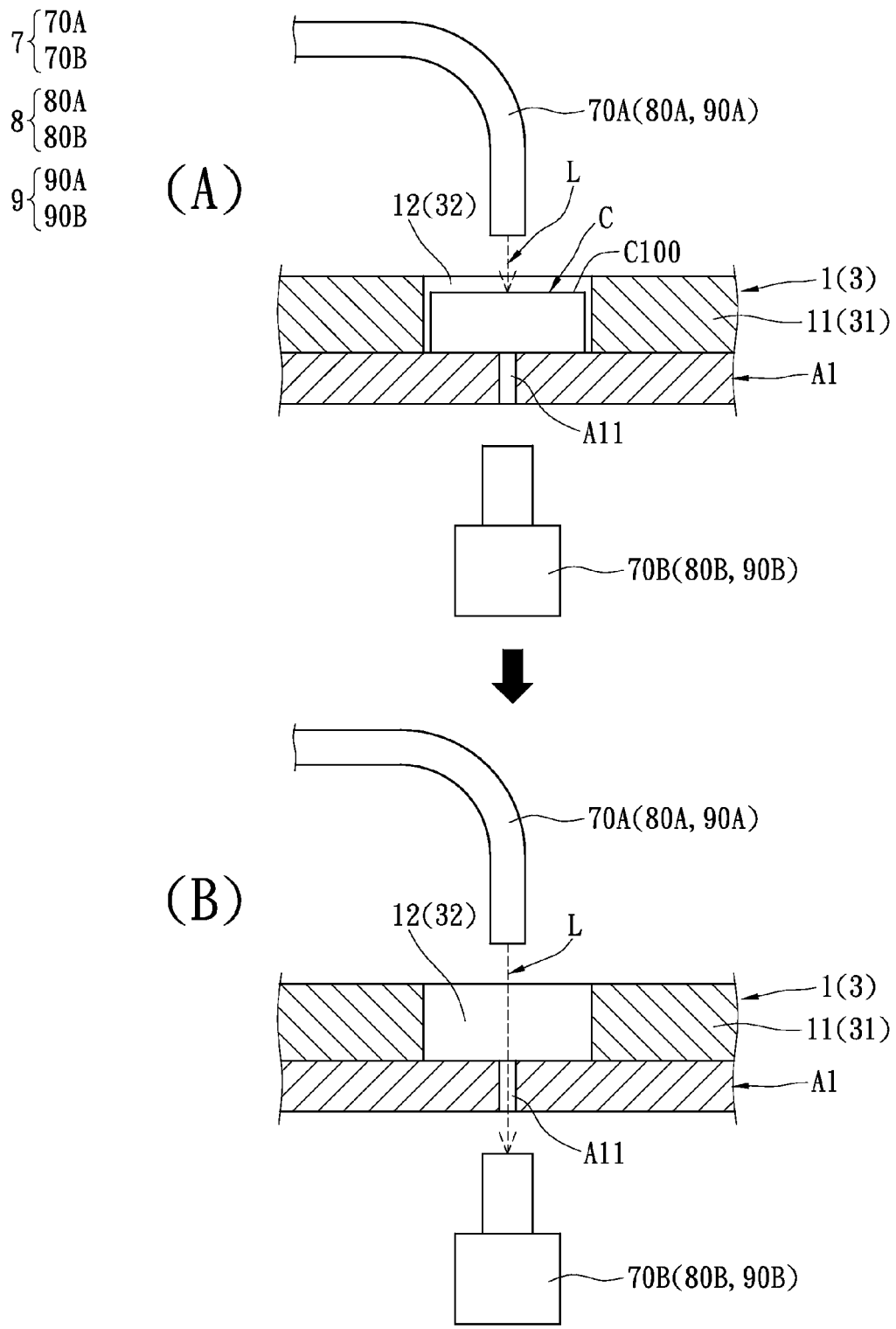
FIG. 1G(A) shows a lateral, cross-sectional, schematic view of before separating the LED package chip from the first receiving portion or the second receiving portion according to the first embodiment of the instant disclosure.

Referring to FIGS. 1A, 1B, and 1G, the first embodiment of the instant disclosure further comprises a chip position detection unit 7 including a light emitting element 70A disposed above the first receiving portion 12 and adjacent to the at least one transportation element 60 and a chip position detection element 70B disposed under the first receiving portion 12 and corresponding to the light emitting element 70A. In addition, light beams L generated by the light emitting element 70A can be selectively projected onto the top surface C100 of the LED package chip C (as shown in the step (A) of FIG. 1G) or transmitted to the chip position detection element 70B through a through hole A11 penetrating through the at least one bearing base A1 and disposed under the first receiving portion 12 (as shown in the step (B) of FIG. 1G), in order to judge whether the LED package chip C is transmitted from the at least one transportation element 60 to the first receiving portion 12. For example, the first suction-exhaust dual-purpose opening 13 can provide induced air flows to suck the LED package chip C from the at least one transportation element 60 to the first receiving portion 12.

Referring to FIGS. 1A, 1B, 1E, and 1G, the first embodiment of the instant disclosure further comprises a first chip breakaway detection unit 8 including a plurality of first light emitting elements 80A respectively disposed above the different first receiving portions 12 and adjacent to the different first chip classification modules 40 and a plurality of first chip breakaway detection elements 80B respectively disposed under the different first receiving portions 12 and corresponding to the first light emitting elements 80A. In addition, light beams L generated by each first light emitting element 80A can be selectively projected onto the top surface C100 of the LED package chip C (as shown in the step (A) of FIG. 1G) or transmitted to the first chip breakaway detection element 80B through a through hole A11 penetrating through the at least one bearing base A1 and disposed under the first receiving portion 12 (as shown in the step (B) of FIG. 1G), in order to judge whether the LED package chip C is transmitted from the first receiving portion 12 to the first chip classification module 40 or the second receiving portion 32. For example, the first suction-exhaust dual-purpose opening 13 can provide exhaust stream to separate the LED package chip C from the first receiving portion 12.

Referring to FIGS. 1A, 1B, 1F, and 1G, the first embodiment of the instant disclosure further comprises a second chip breakaway detection unit 9 including a plurality of second light emitting elements 90A respectively disposed above the different second receiving portions 32 and adjacent to the different second chip classification modules 50 and a plurality of second chip breakaway detection elements 90B respectively disposed under the different second receiving portions 32 and corresponding to the second light emitting elements

90A. In addition, light beams L generated by each second light emitting element 90A can be selectively projected onto the top surface C100 of the LED package chip C (as shown in the step (A) of FIG. 1G) or transmitted to the second chip breakaway detection element 90B through a through hole A10 penetrating through the at least one bearing base A1 and disposed under the second receiving portion 32 (as shown in the step (B) of FIG. 1G), in order to judge whether the LED package chip C is transmitted from the first receiving portion 12 to the second receiving portion 32 or judge whether the LED package chip C is transmitted from the second receiving portion 32 to the second chip classification module 50. For example, the second suction-exhaust dual-purpose opening 33 can provide exhaust stream to separate the LED package chip C from the second receiving portion 32.

Referring to FIGS. 1A and 1B, the first embodiment of the instant disclosure further comprises a bridge connection unit B including at least one bridge connection element B1 disposed between the first rotation unit 1 and the second rotation unit 3, and each LED package chip C can be transmitted from the first receiving portion 12 to the second receiving portion 32 through the at least one bridge connection element B1.

Figure 1H:
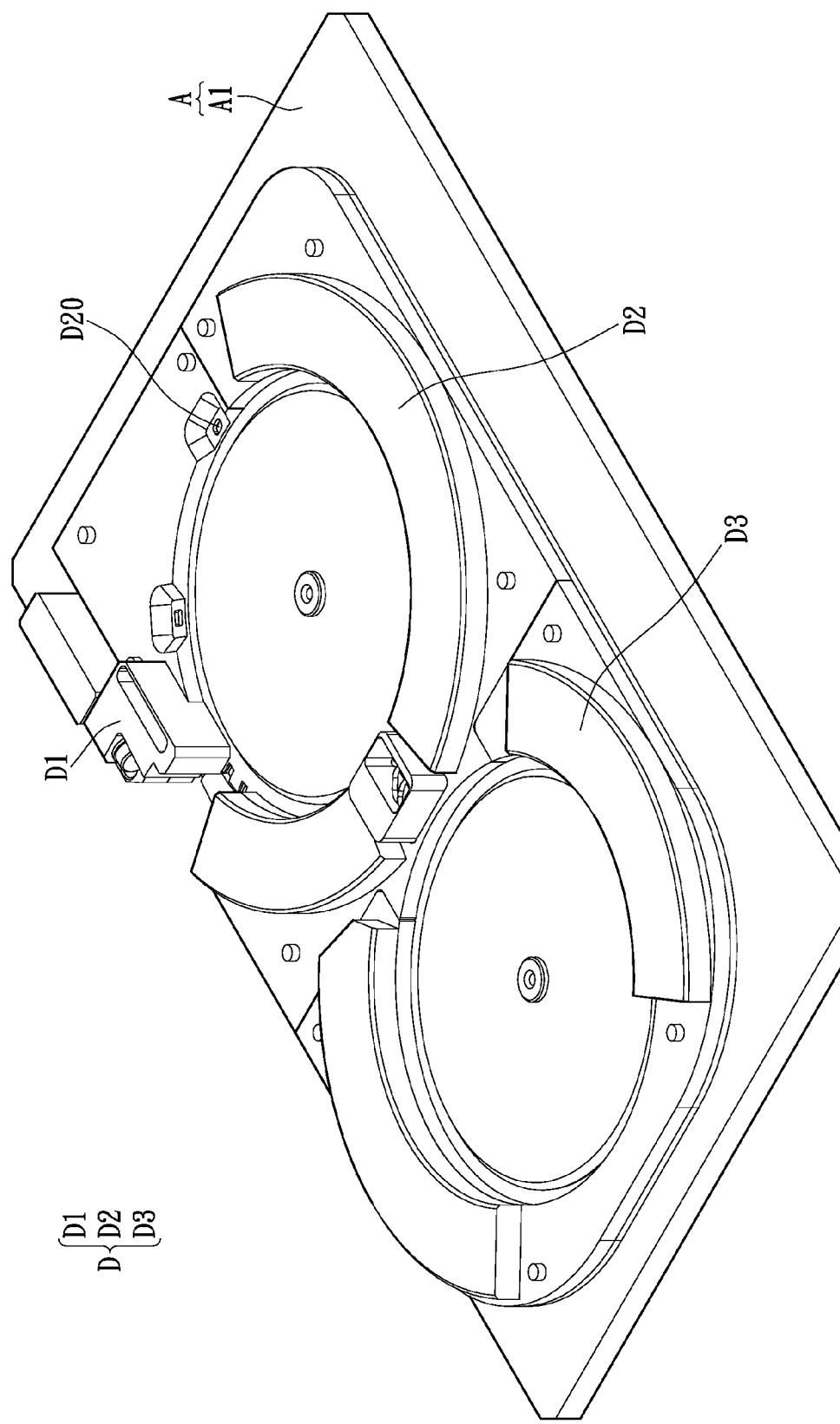
FIG. 1H shows a perspective, schematic view of the LED package chip classification system covered by the protection structure according to the first embodiment of the instant disclosure.

Referring to FIG. 1H, the first embodiment of the instant disclosure further comprises a protection cover structure D including a first protection cover D1 for covering and protecting the chip position detection unit 7, a second protection cover D2 for covering and protecting the first chip breakaway detection unit 8, and a third protection cover D3 for covering and protecting the second chip breakaway detection unit 9. The second protection cover D2 has a test opening D20 for exposing the LED package chip C, and the chip test module 20 of the chip test unit 2 is disposed above the test opening D20. Hence, the chip test module 20 can be used to test each LED package chip C through the test opening D20.

Second Embodiment

Figure 2A:
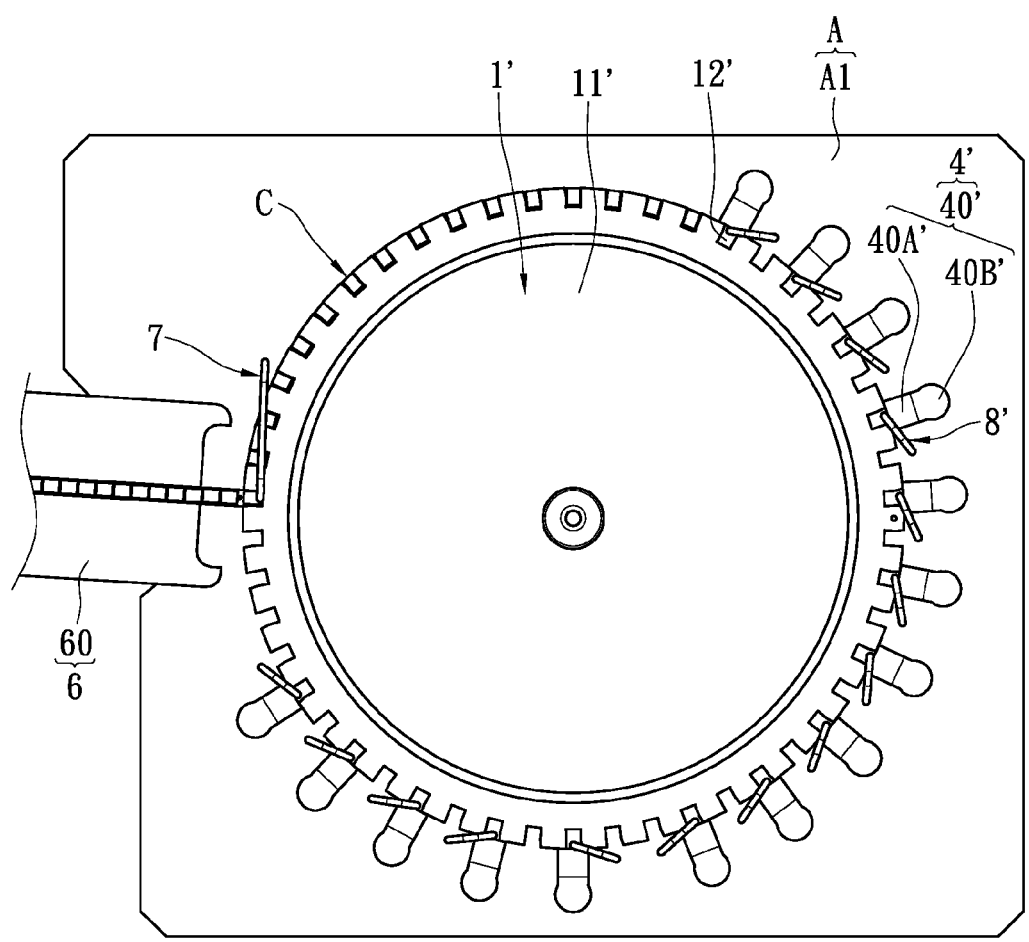
FIG. 2A shows a perspective, schematic view of the LED package chip classification system according to the second embodiment of the instant disclosure.
Figure 2B:
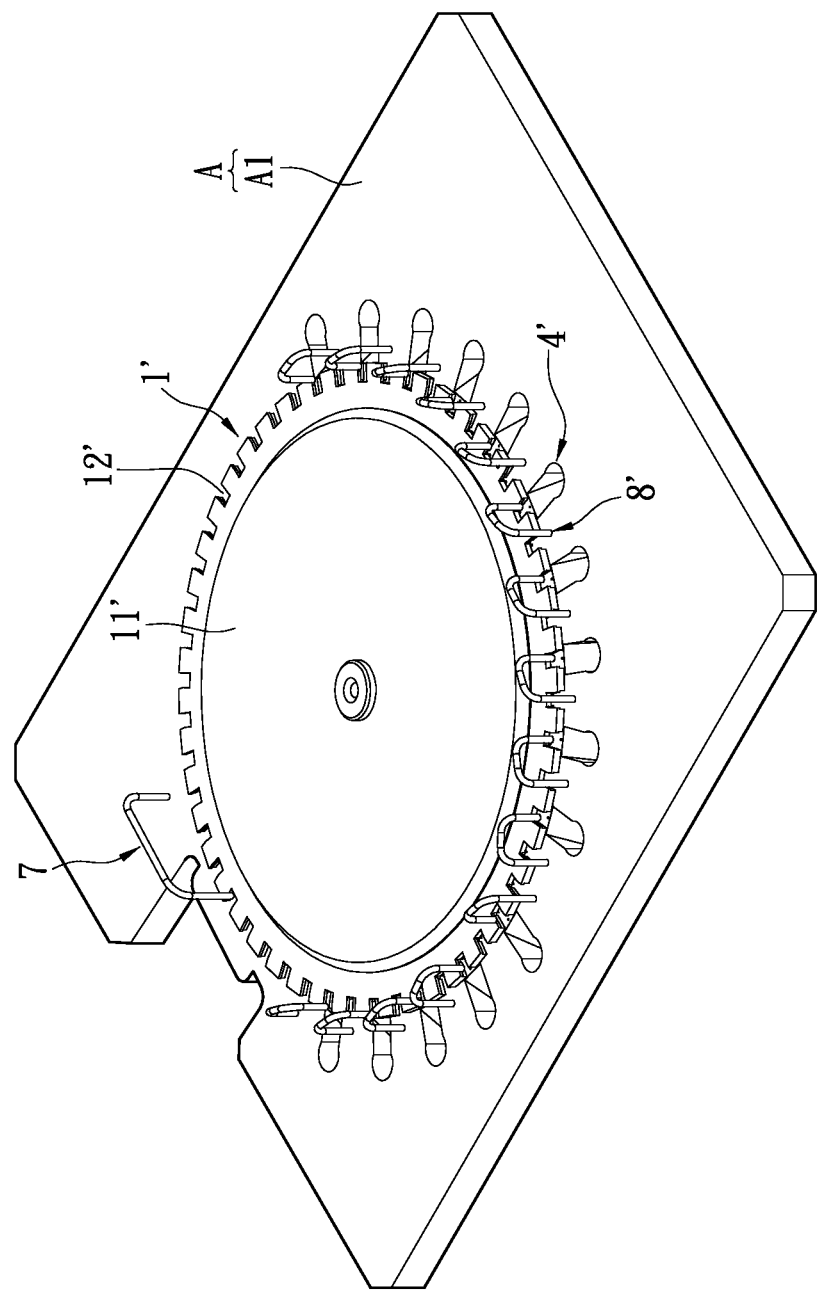
FIG. 2B shows a top, schematic view of the LED package chip classification system according to the second embodiment of the instant disclosure.
Figure 2C:
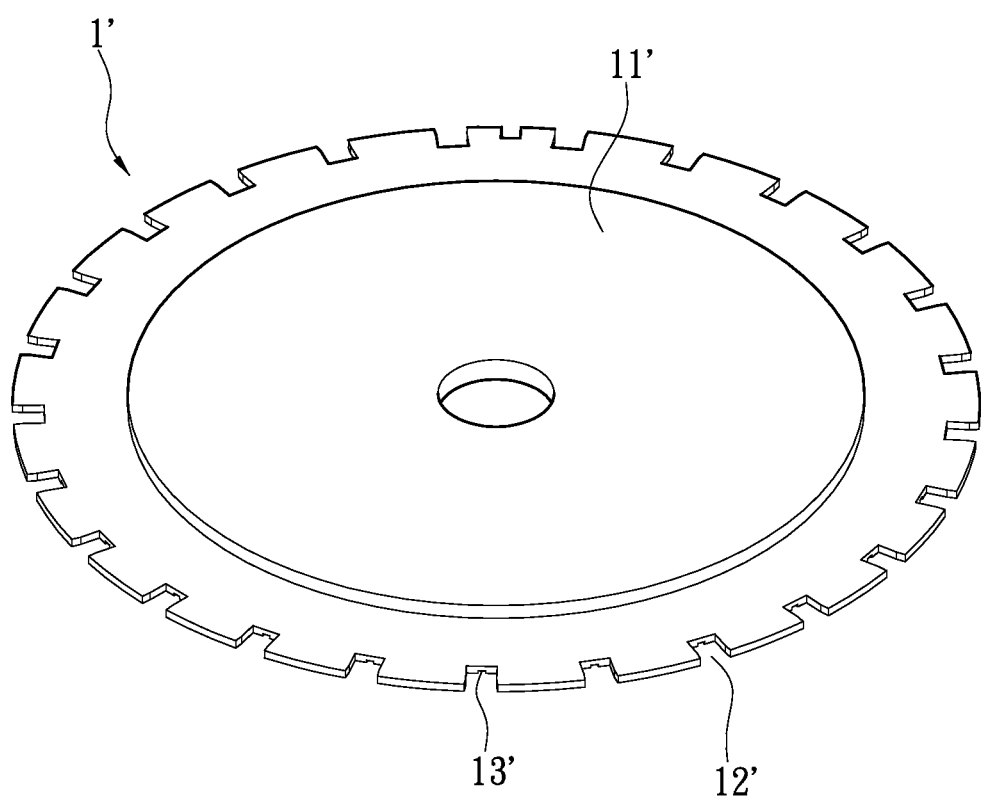
FIG. 2C shows a perspective, schematic view of the rotation unit of the LED package chip classification system according to the second embodiment of the instant disclosure.

Referring to FIGS. 2A to 2C, where the second embodiment of the instant disclosure provides an LED package chip classification system, comprising: a rotation unit 1' for transporting a plurality of LED package chips C, a chip test unit (not shown, but the same as the first embodiment), a chip classification unit 4', a transportation unit 6, a chip position detection unit 7, and a chip breakaway detection unit 8'. Comparing FIG. 2A with FIG. 1A and comparing FIG. 2B with FIG. 1B, the difference between the second embodiment and the first embodiment is that: the second embodiment can omit the second rotation unit 3 as shown in the first embodiment.

The rotation unit 1' includes at least one rotary turntable 11', a plurality of receiving portions 12' formed on the rotary turntable 11', and a plurality of suction-exhaust dual-purpose openings 13' respectively disposed in the receiving portions 12'. Each receiving portion 12' can selectively receive at least one of the LED package chips C, and each LED package chip C has a positive electrode pad (not shown) and a negative electrode pad (not shown) disposed on the bottom side thereof. For example, the receiving portions 12' can be arranged as an annular shape. The receiving portions 12' can be surroundingly formed on the peripheral surface of the at least one rotary turntable 11' and each receiving portion 12' has an outward opening, thus each LED packaged chip C can enter the receiving portion 12' through the outward opening.

The chip test unit (not shown) includes at least one chip test module (not shown, but the same as the first embodiment) adjacent to the rotation unit 1' for testing each LED package chip C. For example, the at least one chip test module (not shown) includes a power supply element (not shown, but the same as the first embodiment) under the LED package chip C to supply power to the LED package chip C and a chip test element (not shown, but the same as the first embodiment) disposed above the LED package chip C to test each LED package chip C for obtaining the luminescent property of each LED package chip C.

The chip classification unit 4' includes a plurality of chip classification modules 40' adjacent to the rotation unit 1' for classifying the LED package chips C that have been tested by the at least one chip test module (not shown), and the chip classification modules 40' can surround the at least one rotary turntable 11'. Moreover, each chip classification module 40' includes a passing portion 40A' and an accommodating portion 40B' communicated with the passing portion 40A', and the passing portion 40A' and the accommodating portion 40B' of each chip classification module 40' are mated with each other to receive the LED package chips C with the same luminescent property. For example, the passing portion 40A' can be a passing inclined plane communicated with the receiving portion 12', the accommodating portion 40B' can be an accommodating opening communicated with the passing inclined plane, and the passing inclined plane (the passing portion 40A') is gradually and downwardly inclined from the receiving portion 12' to the accommodating portion (the accommodating portion 40B').

The transportation unit 6 includes at least one transportation element 60 adjacent to first rotary turntable 11' for sequentially transporting each LED package chip C to the corresponding receiving portion 12'.

The chip position detection unit 7 includes a light emitting element (not shown, but the same as the first embodiment) disposed above the receiving portion 12' and adjacent to the at least one transportation element 60 and a chip position detection element (not shown, but the same as the first embodiment) disposed under the receiving portion 12' and corresponding to the light emitting element (not shown). In addition, the chip position detection unit 7 can be used to judge whether the LED package chip C is transmitted from the at least one transportation element 60 to the receiving portion 12'.

The chip breakaway detection unit 8' includes a plurality of light emitting elements (not shown, but the same as the first embodiment) respectively disposed above the different receiving portions 12' and adjacent to the different chip classification modules 40' and a plurality of chip breakaway detection elements (not shown, but the same as the first embodiment) respectively disposed under the different receiving portions 12' and corresponding to the light emitting elements (not shown). In addition, the chip breakaway detection unit 8' can be used to judge whether the LED package chip C is transmitted from the receiving portion 12' to the chip classification module 40'.

Furthermore, the second embodiment of the instant disclosure further comprises a bearing unit A including at least one bearing base A1, and the at least one rotary turntable 11' can be disposed on the at least one bearing base A1.

In conclusion, the LED package chip classification system of the instant disclosure can be used to classify the LED package chips by matching the rotation unit, the chip test unit, and the chip classification unit.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. An LED package chip classification system, comprising:
a rotation unit for transporting a plurality of LED package chips, wherein the rotation unit includes at least one rotary turntable, a plurality of receiving portions formed on the rotary turntable, and a plurality of suction-exhaust dual-purpose openings respectively disposed in the receiving portions, each receiving portion selectively receives at least one of the LED package chips, and each LED package chip has a positive electrode pad and a negative electrode pad disposed on the bottom side thereof;
a bearing unit including at least one bearing base, wherein the at least one rotary turntable is disposed on the at least one bearing base;
a chip test unit including at least one chip test module adjacent to the rotation unit for testing each LED package chip; and
a chip classification unit including a plurality of chip classification modules adjacent to the rotation unit for classifying the LED package chips that have been tested by the at least one chip test module, wherein the chip classification modules surround the at least one rotary turntable;
a transportation unit including at least one transportation element adjacent to the rotary turntable for sequentially transporting each LED package chip to the corresponding receiving portion; and
a chip position detection unit including a light emitting element disposed above the receiving portion adjacent to the at least one transportation element, and a chip position detection element disposed under the receiving portion corresponding to the light emitting element;
wherein light beams generated by the light emitting element are selectively projected onto the top surface of the LED package chip or transmitted to the chip position detection element through a through hole penetrating through the at least one bearing base and disposed under the receiving portion in order to judge whether the LED package chip is transmitted from the at least one transportation element to the receiving portion.

2. The LED package chip classification system of claim 1, wherein the receiving portions are arranged as an annular shape, and the receiving portions are surroundingly formed on the peripheral surface of the at least one rotary turntable.

3. The LED package chip classification system of claim 1, wherein the at least one chip test module includes a power supply element under the LED package chip to supply power to the LED package chip and a chip test element disposed above the LED package chip to test each LED package chip for obtaining the luminescent property of each LED package chip.

4. The LED package chip classification system of claim 3, wherein each chip classification module includes a passing portion and an accommodating portion communicated with the passing portion, and the passing portion and the accommodating portion of each chip classification module are mated with each other to receive the LED package chips with the same luminescent property.

5. The LED package chip classification system of claim 4, wherein the passing portion is a passing inclined plane communicated with the receiving portion, the accommodating portion is an accommodating opening communicated with the passing inclined plane, and the passing inclined plane is gradually and downwardly inclined from the receiving portion to the accommodating opening.

6. The LED package chip classification system of claim 1, further comprising: a chip breakaway detection unit including a plurality of light emitting elements respectively disposed above the different receiving portions and adjacent to the different chip classification modules and a plurality of chip breakaway detection elements respectively disposed under the different receiving portions and corresponding to the light emitting elements, wherein light beams generated by each light emitting element are selectively projected onto the top surface of the LED package chip or transmitted to the chip breakaway detection element through a through hole penetrating through the at least one bearing base and disposed under the receiving portion in order to judge whether the LED package chip is transmitted from the receiving portion to the chip classification module.

7. An LED package chip classification system, comprising:
a first rotation unit for transporting a plurality of LED package chips, wherein the first rotation unit includes at least one first rotary turntable, a plurality of first receiving portions formed on the first rotary turntable, and a plurality of first suction-exhaust dual-purpose openings respectively disposed in the first receiving portions, each first receiving portion selectively receives at least one of the LED package chips, and each LED package chip has a positive electrode pad and a negative electrode pad disposed on the bottom side thereof;
a chip test unit including at least one chip test module adjacent to the first rotation unit for testing each LED package chip;
a second rotation unit adjacent to the first rotation unit, wherein the second rotation unit includes at least one second rotary turntable, a plurality of second receiving portions formed on the second rotary turntable, and a plurality of second suction-exhaust dual-purpose openings respectively disposed in the second receiving portions, and each second receiving portion selectively receives at least one of the LED package chips transmitted from the first rotation unit;
a bearing unit including at least one bearing base, wherein the at least one first rotary turntable and the at least one second rotary turntable are disposed on the at least one bearing base;
a first chip classification unit including a plurality of first chip classification modules adjacent to the first rotation unit for classifying the LED package chips that have been tested by the at least one chip test module, wherein the first chip classification modules surround the at least one first rotary turntable; and
a second chip classification unit including a plurality of second chip classification modules adjacent to the second rotation unit for classifying the LED package chips that have been tested by the at least one chip test module, wherein the second chip classification modules surround the at least one second rotary turntable.

8. The LED package chip classification system of claim 7, further comprising: a transportation unit including at least one transportation element adjacent to the first rotary turntable for sequentially transporting each LED package chip to the corresponding first receiving portion.

9. The LED package chip classification system of claim 8, further comprising: a chip position detection unit including a light emitting element disposed above the first receiving portion and adjacent to the at least one transportation element and a chip position detection element disposed under the first receiving portion and corresponding to the light emitting element, wherein light beams generated by the light emitting element are selectively projected onto the top surface of the LED package chip or transmitted to the chip position detection element through a through hole penetrating through the at least one bearing base and disposed under the first receiving portion in order to judge whether the LED package chip is transmitted from the at least one transportation element to the first receiving portion.

10. The LED package chip classification system of claim 7, wherein the first receiving portions are arranged as an annular shape, the second receiving portions are arranged as an annular shape, the first receiving portions are surroundingly formed on the peripheral surface of the at least one first rotary turntable, and the second receiving portions are surroundingly formed on the peripheral surface of the at least one second rotary turntable.

11. The LED package chip classification system of claim 7, wherein the at least one chip test module includes a power supply element under the LED package chip to supply power to the LED package chip and a chip test element disposed above the LED package chip to test each LED package chip for obtaining the luminescent property of each LED package chip.

12. The LED package chip classification system of claim 11, wherein each first chip classification module includes a first passing portion and a first accommodating portion communicated with the first passing portion, and the first passing portion and the first accommodating portion of each first chip classification module are mated with each other to receive the LED package chips with the same luminescent property, wherein each second chip classification module includes a second passing portion and a second accommodating portion communicated with the second passing portion, and the second passing portion and the second accommodating portion of each second chip classification module are mated with each other to receive the LED package chips with the same luminescent property.

13. The LED package chip classification system of claim 12, wherein the first passing portion is a first passing inclined plane communicated with the first receiving portion, the first accommodating portion is a first accommodating opening communicated with the first passing inclined plane, and the first passing inclined plane is gradually and downwardly inclined from the first receiving portion to the first accommodating opening, wherein the second passing portion is a second passing inclined plane communicated with the second receiving portion, the second accommodating portion is a second accommodating opening communicated with the second passing inclined plane, and the second passing inclined plane is gradually and downwardly inclined from the second receiving portion to the second accommodating opening.

14. The LED package chip classification system of claim 7, further comprising: a first chip breakaway detection unit including a plurality of first light emitting elements respectively disposed above the different first receiving portions and adjacent to the different first chip classification modules and a plurality of first chip breakaway detection elements respectively disposed under the different first receiving portions and corresponding to the first light emitting elements, wherein light beams generated by each first light emitting element are selectively projected onto the top surface of the LED package chip or transmitted to the first chip breakaway detection element through a through hole penetrating through the at least one bearing base and disposed under the first receiving portion in order to judge whether the LED package chip is transmitted from the first receiving portion to the first chip classification module or the second receiving portion.

15. The LED package chip classification system of claim 14, further comprising: a second chip breakaway detection unit including a plurality of second light emitting elements respectively disposed above the different second receiving portions and adjacent to the different second chip classification modules and a plurality of second chip breakaway detection elements respectively disposed under the different second receiving portions and corresponding to the second light emitting elements, wherein light beams generated by each second light emitting element are selectively projected onto the top surface of the LED package chip or transmitted to the second chip breakaway detection element through a through hole penetrating through the at least one bearing base and disposed under the second receiving portion in order to judge whether the LED package chip is transmitted from the first receiving portion to the second receiving portion or judge whether the LED package chip is transmitted from the second receiving portion to the second chip classification module.

16. The LED package chip classification system of claim 15, further comprising: a bridge connection unit including at least one bridge connection element disposed between the first rotation unit and the second rotation unit, wherein each LED package chip is transmitted from the first receiving portion to the second receiving portion through the at least one bridge connection element.

* * * * *